(12) United States Patent
Li et al.

(10) Patent No.: US 10,700,654 B2
(45) Date of Patent: Jun. 30, 2020

(54) HIGH DYNAMIC RANGE CAPACITOR TRANSIMPEDANCE AMPLIFIER

(71) Applicant: Gpixel Changchun Optotech Inc., Changchun (CN)

(72) Inventors: Yang Li, Changchun (CN); Tao Jiang, Changchun (CN); Cheng Ma, Changchun (CN)

(73) Assignee: GPIXEL CHANGCHUN OPTOTECH INC., Changchun (CN)

( * ) Notice: Subject to any disclaimer, the term of this patent is extended or adjusted under 35 U.S.C. 154(b) by 92 days.

(21) Appl. No.: 16/106,394

(22) Filed: Aug. 21, 2018

(65) Prior Publication Data
US 2020/0067469 A1  Feb. 27, 2020

(51) Int. Cl.
*H03F 3/45* (2006.01)
*G01J 1/46* (2006.01)

(52) U.S. Cl.
CPC ............ *H03F 3/45475* (2013.01); *G01J 1/46* (2013.01); *H03F 2200/129* (2013.01); *H03F 2203/45116* (2013.01); *H03F 2203/45514* (2013.01); *H03F 2203/45631* (2013.01); *H03F 2203/45634* (2013.01)

(58) Field of Classification Search
CPC .................. H04N 5/378; H04N 5/243
See application file for complete search history.

(56) References Cited

U.S. PATENT DOCUMENTS

2012/0119787 A1* 5/2012 Sakuragi ............. H04N 5/3658
                                                              327/50
2016/0327386 A1* 11/2016 Schrey ................... G01S 7/487

* cited by examiner

*Primary Examiner* — Thanh Luu
(74) *Attorney, Agent, or Firm* — Workman Nydegger

(57) ABSTRACT

A readout circuit, for at least one sensing element, includes an amplifier including an input node for receiving charges from the sensing element or elements and an output node, a first feedback loop comprising a feedback capacitor, and at least one second feedback loop comprising another feedback capacitor, between the output and input nodes of the amplifier, for defining different gains. The at least two feedback capacitors being each connectable to a reference voltage supply via respective switches, for pre-loading the feedback capacitors with a predetermined charge different from the charge obtainable from the at least one sensing element, for sampling signals at a reset level before charge transferal. The loops comprising a respective switch between their capacitors and the output node, for operatively connecting and disconnecting each loop, for obtaining reset voltages at two different gains and signal voltages at two different gains.

14 Claims, 4 Drawing Sheets

HIGH DYNAMIC RANGE CAPACITOR TRANSIMPEDANCE AMPLIFIER

FIELD OF THE INVENTION

The present invention relates to the field of image sensors. More specifically it relates to methods and devices for controlling readouts of pixels using a charge transimpedance amplifier (CTIA).

BACKGROUND OF THE INVENTION

Sensors generate detectable signals upon interaction with a magnitude to be sensed. The signal level is representative of the sensed magnitude, in order to have a good readout. Usually signals are obtained from charges generated in the sensing element as a response to the sensed magnitude. For example, photocharges are generated in radiation sensors (such as infrared, optical, UV sensors . . . ) when radiation impinges on the sensing element or elements in the sensor. These charges need to be measured, for example by converting the charge to a readable signal such as voltage, which is easy to extract and manipulate. Many circuit configurations with different elements exist for performing this conversion. For example, some circuits including amplifiers, such as the capacitor transimpedance amplifier (CTIA), are used in sensing applications for charge-to-voltage conversion.

However, these circuits are typically optimized for obtaining a good signal at either high levels or low levels of the magnitude to be sensed (high levels or low levels of radiation). If a sensor including a circuit for a predetermined range of measurement levels is exposed to different levels outside of this range, the accuracy of the readout drops, so the results will not be exact. For example, a radiation sensor optimized for low levels of radiation will saturate and stop giving meaningful readout of the signal, because the saturated signal level is not representative of the sensed magnitude anymore. On the other hand, a radiation sensor optimized for high levels of radiation will present a readout with a high noise level if the radiation levels are low.

Thus, it would be desirable to obtain a sensing element with good tolerance against saturation, and still presenting good response to low radiation levels.

SUMMARY OF THE INVENTION

It is an object of embodiments of the present invention to provide a sensor readout circuit, a sensor and a method of reading out charges with high dynamic range, high tolerance for saturation, and low noise, allowing offset removal, and allowing selective reading of the signal.

In a first aspect, the present invention provides a readout circuit for reading out charges from at least one sensing element. The readout circuit includes:
an amplifier including an input node for receiving charges from the at least one sensing element and an output node for outputting signal voltages,
a first feedback loop and at least one second feedback loop between the output node and the input node of the amplifier, the first feedback loop comprising a first feedback capacitor and the at least one second feedback loop comprising a second feedback capacitor, for defining different charge-to-voltage conversion gains,
wherein the at least first and second feedback capacitors are each connectable to a reference voltage supply via a switch, for pre-loading the feedback capacitors with a pre- determined charge different from the charge obtainable from the at least one sensing element, for allowing sampling signals from charges at the input node at a reset level before charge transferal.

Further, the first feedback loop comprises a switch between the first feedback capacitor and the output node, and the at least one second feedback loop comprises a switch between the second feedback capacitor and the output node, for operatively connecting and disconnecting each feedback loop, for sampling signals from charges at the reset level at the input node at at least two different charge-to-voltage conversion gains, and for sampling signals from charges received at the input node from the at least one sensing element at at least two different charge-to-voltage conversion gains.

It is an advantage of embodiments of the present invention that the reset voltages for different gains, and the signal voltages for different gains, can be individually obtained. It is a further advantage that saturation of the CTIA output is reduced or avoided, even in the case that a large amount of charges is transferred, by allowing two transfers to take place.

In some embodiments of the present invention, the readout circuit further comprises a signal manipulation portion connected to the output node of the amplifier, for removing offset of the sampled signals.

It is an advantage of embodiments of the present invention that Correlated Double Sampling (CDS) can be performed for the high gain and low gain signal voltages. This allows removing noise such as kTC and 1/f noise, in general offset, and providing a signal with low noise floor.

In some embodiments, the signal manipulation portion is a CDS circuit comprising at least four capacitors, the at least four capacitors being in parallel configuration and being selectably connectable, via switches, to the output of the amplifier.

It is an advantage of embodiments of the present invention that the reset signals for different gain CDS can be performed for the high gain and low gain signal voltages.

In some embodiments of the present invention, the amplifier is an amplifier with high open-loop gain of at least 1000, or at least 60 dB, for example at least 80 dB.

It is an advantage of embodiments of the present invention that all transferred charges from a connected image pixel are accumulated in the at least two feedback capacitors.

In a further aspect, the present invention provides an image sensor including a sensing portion and the readout circuit of the first aspect.

It is an advantage of embodiments of the present invention that an image sensor can be provided that obtains images with high dynamic range, low noise, etc. The sensing portion and readout circuit may be integrated, thus obtaining a compact sensor.

In some embodiments of the present invention, the sensing portion includes a pinned photodiode having a pinning voltage lower than the non-inverting input voltage of the amplifier. It is an advantage of embodiments of the present invention that charge transfer is ensured with small or negligible lag, thus obtaining a fast image sensor.

In a further aspect, the present invention provides a method of reading out charges generated in at least one sensing element connected to an amplifier via an input node for receiving charges from the at least one sensing element, there being a first feedback loop with a first feedback capacitor and at least one second feedback loop with a second feedback capacitor between an output node of the amplifier and the input node. The method comprises the steps of:

resetting the input node of the amplifier to a reset voltage, subsequently charging each of the first feedback capacitor in the first feedback loop and the second feedback capacitor in the at least one second feedback loop with a predetermined charge with the first and at least one second feedback loops operatively disconnected, with at least one of the first or second feedback loops operatively disconnected, and at least one of the second or first feedback loops operatively connected, performing the at least two steps of:

sampling the charge-to-voltage signal at the output node for the predetermined charge, thereby obtaining at least a first sampled voltage signal having at least a first gain for the predetermined charge and any charge at the input node before transfer, and after at least one transfer of charges from the at least one sensing element to the input node of the amplifier, sampling the charge-to-voltage signal at the output node, thereby obtaining at least a second sampled voltage signal having the first gain, and with each of the first and at least one second feedback loops operatively connected, performing the at least two steps of:

sampling the charge-to-voltage signal at the output node for the predetermined charge, thereby obtaining a third sampled voltage signal having at least a second gain for the predetermined charge and any charge at the input node before transfer, and after at least one transfer of charges from the at least one sensing element to the input node of the amplifier, sampling the charge-to-voltage signal at the output node, thereby obtaining a fourth sampled voltage signal having the second gain.

It is an advantage of embodiments of the present invention that the different sampled signals are representative of different gains of the CTIA, both at the reset level and at the signal level transferred from the sensing elements, and can be sampled separately. It is a further advantage of embodiments of the present invention that charge transfer can be separated in two transfers, one with high conversion gain readout and one with a low conversion gain readout, reducing or avoiding saturation effects.

In some embodiments of the present invention, the method further comprises providing removing offset of the signal by correlated double sampling, using the first and second sampled voltage signals for at least a first gain, thus obtaining a first correlated signal, and providing correlated double sampling using the at least third and fourth sampled voltage signals for the at least second gain, thus obtaining a further correlation signal.

It is an advantage of embodiments of the present invention that the offset at different gains can be removed.

In some embodiments of the present invention, the method further comprises storing each sampled charge-to-voltage signal in a different capacitor connected to the output node of the amplifier.

It is an advantage of embodiments of the present invention that CDS can be performed by controlling a switch per capacitor.

In some embodiments of the present invention, the step of charging each of the first feedback capacitor in the first feedback loop and the second feedback capacitor in the at least second feedback loop comprises applying a reference voltage.

It is an advantage of embodiments of the present invention that a reference voltage can be easily tailored and selected for setting the amplifier output to a low voltage level.

In some embodiments of the present invention, the step of charging each of the first feedback capacitor in the first feedback loop and the second feedback capacitor in the at least second feedback loop comprises connecting the capacitor to a reference voltage supply at a node between the capacitor and the output of the amplifier.

It is an advantage of embodiments of the present invention that the reference voltage is connected to the input only through a capacitor, so reset voltage and the reference voltage can be different.

In some embodiments of the present invention, the method further comprises:

operatively connecting the first and the at least one second feedback loops after charging each of the first feedback capacitor in the first feedback loop and the second feedback capacitor, subsequently performing the step of sampling the charge-to-voltage signal at the output for the predetermined charge and any charge at the input, thereby obtaining the third sampled voltage signal having the second gain, subsequently operatively disconnecting one of the first or at least the second feedback loops, subsequently performing the step of sampling the charge-to-voltage signal at the output for the predetermined charge, thereby obtaining the first sampled voltage signal having the first gain, subsequently transferring charges from the sensing element to the input of the amplifier, and performing the step of sampling the charge-to-voltage signal at the output for charges received by the input, thereby obtaining the at least second sampled voltage signal having the first gain, subsequently operatively connecting each of the first and at least the second feedback loops, subsequently transferring charges from the sensing element to the input of the amplifier, and performing the step of sampling the charge-to-voltage signal at the output for charges received by the input, thereby obtaining the at least fourth sampled voltage signal having the second gain.

It is an advantage of embodiments of the present invention that the steps require few steps of connecting and disconnecting the feedback loops, thus simplifying timing, reducing sequential operation complexity and reducing readout time.

In some embodiments of the present invention, resetting the input node of the amplifier to a reset voltage comprises connecting that input node to the output node of the amplifier.

It is an advantage of embodiments of the present invention that no extra voltage supplies are needed for removing charges from the input of the amplifier (e.g. the input connected to the floating diffusion node of the at least one sensing element).

In some embodiments of the present invention, the step of sampling the charge-to-voltage signal at the output node with each of the first and at least one second feedback loops operatively connected, is performed after one transfer of charges from the at least one sensing element to the input node of the amplifier; and the step of sampling the charge-to-voltage signal at the output node with at least one of the first or second feedback loops operatively disconnected, and at least one of the second or first feedback loops operatively connected, is also performed after one transfer of charges from the at least one sensing element to the input node of the amplifier.

It is an advantage of embodiments of the present invention that any excess charge that may saturate the capacitor of a first feedback loop can be stored in the capacitor of the second feedback loop, thereby increasing the capacitance, and the offset, noise and other parasitic signals can be removed also from the signal obtained from the excess charge.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 3A illustrates the pixel and the CTIA in detail, while

Figure 1:
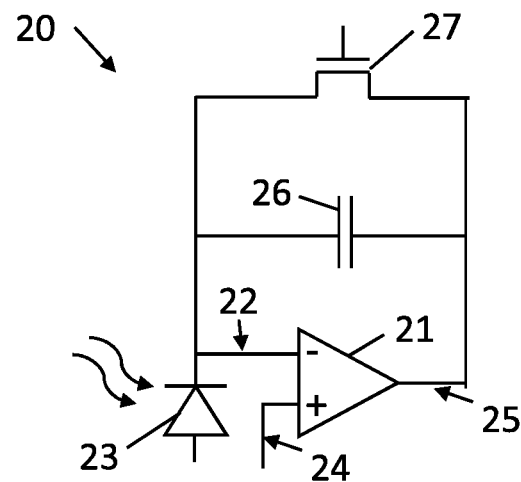
FIG. 1 illustrates a prior art CTIA.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "switches", reference is made to elements that selectably allow or prevent the circulation of charges. For example, they may include gates, transistors (e.g. MOSFETS, BJT . . . ), but the present invention is not limited to these examples.

A sensor usually includes one or more sensing elements which generate charges as a reaction to a change in a magnitude. Although the present invention could in principle be used to any suitable sensor which generates charges or current as a response (for example, it could be applied to accelerometers), the present disclosure will be explained mainly with reference to radiation sensors. Where in embodiments of the present invention reference is made to "radiation", reference is made to radiation in the broad sense, including electromagnetic radiation (visible spectrum, and also UV, IR radiation, and respectively higher and lower wavelengths), and even other types of radiation (e.g. particle radiation).

The charges generated in the sensing element (usually, but not necessarily always, electrons) can be transferred and converted to a readable signal, in the form of an electrical signals such as a current or a voltage. A transimpedance amplifier, for example a capacitor transimpedance amplifier (CTIA), can be used as a converter, for example a charge-to-voltage converter, and to amplify a current output (the charges) of the sensing element.

The prior art CTIA 20 of FIG. 1 includes an operational amplifier 21, or equivalent amplification element, with a first input node 22 for allowing connection with a photodiode 23. A potential is introduced in the second input node 24 of the amplifier 21. It also includes an output node 25 for outputting the signal extracted from the photodiode 23, for example to a unit for processing signals, and/or a display unit. The CTIA further comprises a feedback loop and a capacitor 26 therein, known as "feedback capacitor", which determines the conversion gain of the CTIA. A reset switch 27 is usually included for resetting the input node 22, for example before starting accumulation of charges generated in the photodiode 23 upon impingement of radiation thereon. In order to obtain a high conversion gain, the capacitor 26 shows usually low capacitance. For high levels of impinging radiation, a large amount of charges is generated, and if the capacitor 26 shows low capacitance, upon transferal of a large amount of charge, the CTIA output may saturate. The signal does not represent accurately the charges generated at the photodiode, which negatively affects the quality and accuracy of readout. On the other hand, if low conversion gain is required, the capacitor usually shows high capacitance, but at low levels of impinging radiation, the noise will be very high, reducing quality of readout.

The present invention provides a transimpedance amplifier, more specifically a capacitor transimpedance amplifier (CTIA) which can be used as a charge-to-voltage converter, including two selectable feedback capacitors. In particular, a readout circuit comprising such CTIA is disclosed. The feedback capacitors can be externally charged, for example by a reference voltage supply. By sequencing the sampling of signals using selectively the capacitors in the feedback loops, two charge transfers in a same cycle can be done during exposure of the sensing element, at two or more conversion gains. In other words, the number of feedback capacitors, as well as their capacitance, determine the gain. Additionally, sampling the reset signals can be done at these two or more conversion gains (by selectively using the same capacitors in the feedback loops), so it is possible to remove the offset signal from the output signals at those two or more conversion gains. The reset noise (the noise at the CTIA reset state, or initial noise) can be also removed by sampling the reset signal. For a low conversion gain, all feedback capacitors can be advantageously used, thus reducing the possibility of saturation.

Figure 2:
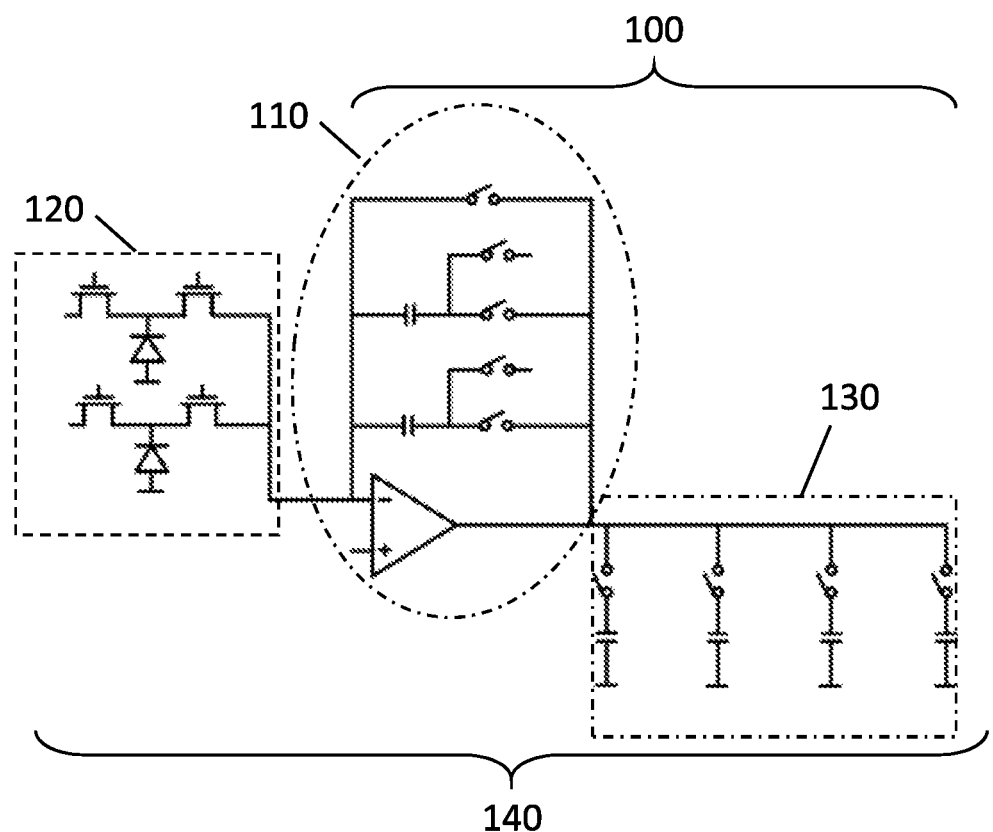
FIG. 2 illustrates a sensor including at least one pixel, the pixel being connected to a CTIA and a CDS circuit forming the readout circuit, in accordance with embodiments of the present invention.

In a first aspect, the present invention relates to a sensor and a readout circuit (e.g. a readout circuit for a photosensor) comprising a capacitor transimpedance amplifier (CTIA). FIG. 2 shows an exemplary sensor 140 in accordance with embodiments of the present invention, including a sensing portion 120 (for example, one or more pixels), and a readout circuit 100 including a CTIA 110 and a signal manipulation portion 130. The sensing portion 120 is connected to the CTIA via an input of the amplifier, and can transfer charges to that input, which may act as a floating node (e.g. a floating diffusion node, in case the node is included in a semiconductor chip). The output of the CTIA 110 is connected to the signal manipulation 130, which may be a CDS circuit. The sensing portion 120 and the CTIA 110 are shown in detail in FIG. 3A, while the signal manipulation portion 130 is shown in detail in FIG. 3B.

Figure 3A:
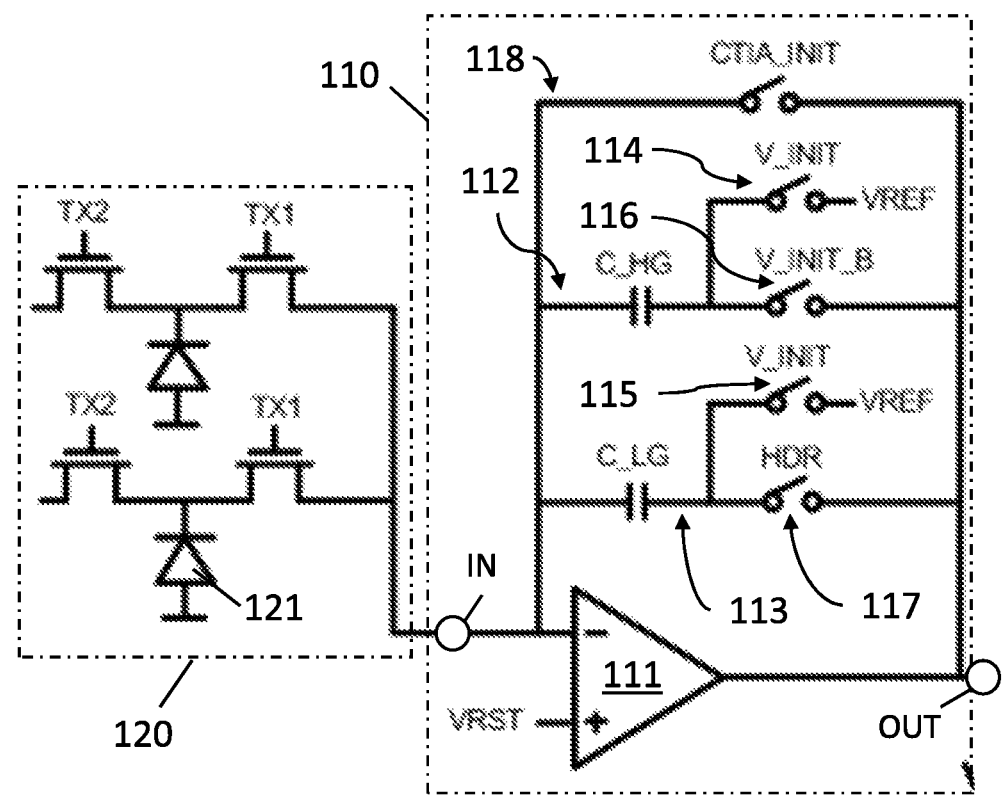

The exemplary CTIA 110 in accordance with embodiments of the present invention is shown in FIG. 3A, comprising and amplifier 111 and a first feedback loop 112 and at least one second feedback loop 113, connecting the output node OUT of the amplifier 111 with the input node IN, each of these first and second feedback loops including a feedback capacitor C_HG, C_LG, respectively, connected to the input node IN of the amplifier 111.

In some embodiments, the input node IN can receive charges from the sensing portion 120, e.g. may be connected to the sensing portion such as one or more pixels, for example to the sensing elements 121 of the pixels. The pixels may include other electronic elements. For example, the connection may be done for example via transfer gates TX1. However, other types of pixels may be used, e.g. pixels with no transfer gate, for example some of the pixels obtained by the so-called "flip-chip" technology.

The amplifier 111 may be for example an operational amplifier. The input node IN may be connected to the inverting input of the amplifier 111. In some embodiments, the amplifier 111 is a high open-loop gain amplifier, thus the amplifier presents high gain in open loop configuration (when no connection is established between the input and output). This high gain may be for example a ratio gain of 1000 or more, or a gain of 60 dB or more, for example 80 dB or more. This ensures that the transferred charge from the sensing portion 120 can be accumulated on the feedback capacitors.

The amplifier 111 may include a second input node (e.g. a non-inverting input), which may be at a predetermined potential. For example, the non-inverting input may be connected to a voltage supply VRST which may provide a predetermined reset voltage. This voltage may be chosen in accordance with the type and accumulation voltage levels of the sensing portion 120 and to obtain a good charge transfer, for example a complete transfer of charges generated due to impinging radiation. For example, VRST may provide 4V. For example, it may be as high as the voltage supply for the CTIA (which may be, for example, 5V), or for example as low as the pinning voltage of the sensing element (Vpin), although in order to provide effective transfer it is preferred a higher voltage than Vpin, for example 2V or higher.

The feedback capacitors C_HG, C_LG of the first and second feedback loops may define different gains, for instance two different gains such as a high gain and low gain in the case of two feedback loops being present. The actual gain of the circuit depends on which feedback loop is operatively connected (or active, thus electrically connecting the output to the input, in a closed loop) in the CTIA 110. The capacitance of the different capacitors C_HG, C_LG may be different so the dynamic range is extended, although the present invention may include capacitors with the same capacitances. For example, the capacitances may be in the scale of several femtoFarads (fF), e.g. 1 fF to 10 fF, for one capacitor C_HG to provide signal with low noise, and in the scale of tens or dozens of fF, e.g. 10 fF to 100 fF, for the at least second capacitor C_LG to provide high capacity.

Further, the feedback capacitors C_HG, C_LG can be pre-charged. For example, they may be connectable to a voltage supply VREF which may provide a predetermined reference voltage. The connection between the supply VREF and the capacitors may be regulated by a switch 114, 115 between the supply VREF and each capacitor C_HG, C_LG. The reference voltage provided by the supply VREF may be a relatively low voltage, in order to set the output node OUT at a low voltage before transfer of charges takes place. A relatively low voltage is preferred, so the CTIA output voltage swing can be accordingly large. In other words, the increase of the CTIA output voltage due to negative charge (electrons) transferred improves if a low voltage is set. For example, a supply VREF may provide 1.1 V, for example for ADC input. Other values can be used, for example any voltage between and including 0.5V and 1.5V.

The supply VREF may be connectable at the output OUT of the amplifier 111, but because the capacitors can be pre-charged, it means that the capacitors may retain the charge by including means to isolate the capacitor from the output node OUT. In embodiments of the CTIA of the present invention, the feedback loops 112, 113 with capacitors C_HG, C_LG include a so-called loop switch 116, 117, for example a gate or transistor, which can operatively connect (e.g. close) and operatively disconnect (e.g. open) the corresponding feedback loop between the capacitor and the output node OUT of the amplifier. This allows readout of charges at low and high gain separately, with limited or no risk of saturation. Moreover, these switches may isolate the respective capacitor from the output node OUT, so the feedback capacitors can be pre-charged and retain the charge while being isolated from the output when the loop switches 116, 117 are in an open state. This allows the reset signals to be read separately, so offset can be reduced in both high and low gain. CTIA reset noise can be reduced also by sampling the reset signal in the capacitors C_HG, C_LG, as it will be explained below.

For example, in the particular embodiment shown in FIG. 3A, the connection to the reference supply VREF may take place between each capacitor C_HG, C_LG and its respective loop switch 116, 117. Thus, when a loop switch is open, the capacitor of that node is connected on one side to the input node IN, while the other side is floating, and charge can be retained. Other features may be used to keep the capacitors pre-charged.

Providing selectability of the feedback loops, thus allowing to activate one loop only or more than one loop, e.g. both loops 112, 113, brings the advantage that the gain can be selected. This enables also the possibility of dividing the transfer of generated charges, for example in two transfer steps. The transfers can be done at the end of the exposure, for example a first transfer can be done to a first capacitor, and a second transfer can be done to a second capacitor; the charges transferred to the second capacitor may be excess charges which would saturate the first capacitor. In alternative embodiments, a first transfer can be done at an intermediate time point of the charge generation and accumulation period, e.g. at half way of charge generation and accumulation. The amount of generated charges to be transferred may be reduced (e.g. halved) with respect to the amount that would be generated at the end of the entire exposure.

Thus, only one feedback loop 112 including one capacitor C_HG may be operative during this first transfer (for example by closing its switch 116). The signal can be sampled (e.g. by reading out the signal) at the output of the CTIA at a first gain, or high gain (e.g. at the end of the exposure, or at an intermediate time during exposure). A second transfer may be done at the end of the exposure, while both feedback loops 112, 113 are active (e.g. by closing the switches 116, 117 of the loops), thus avoiding saturation, and the signal can be sampled at a second gain, or low gain, for the second transfer.

Further, providing pre-charge of the capacitors allows to advantageously obtain the offset signals separately for the first and second gain, by allowing sampling the signal with one of the feedback loops 112 active (operatively connected, e.g. by closing the relevant switch 116) before any transfer of charge from the sensing portion 120, thus sampling the signal generated by the precharge of the capacitor C_HG and obtaining the signal corresponding to reset levels at a first gain (e.g. a high gain), and repeating the process with both loops active before any transfer of charge, thus obtaining the signal of the reset levels at a second gain (e.g. a low gain). Because the reference voltage VREF is known, any remaining charge in the input node IN (e.g. charges in a floating diffusion node from a previous transfer and readout of the sensing portion 120) can be detected and read at the output, because these charges will affect the charges preloaded in the capacitor or capacitors, as they may lower the voltage drop along the capacitors with respect to the known reference voltage VREF. Thus, the offset can be obtained for two different gains. It is to be noted that the reset noise is also recorded by the capacitors, and that the thermal noise is also sampled, and it can be subtracted via CDS.

The presence of switches 116, 117 for connecting or disconnecting the feedback loops allows using one capacitor C_HG for high gain signals (e.g. signals obtained from charges transferred during exposure of the sensing element to impinging radiation), or using both capacitors C_HG, C_LG for low gain signals (e.g. signals obtained from charges transferred at the end of the exposure of the sensing element).

The present invention is not limited to two feedback loops being present. A further loop 118 may be included, for example a loop including a switch CTIA_INIT, for short-circuiting the input and the output of the amplifier. No capacitor may be present in such loop (only parasitic capacitance may be present, if any). For example, this loop may be used for resetting the input node IN to a known voltage, e.g. the reset voltage VRST of the non-inverting input. For example, the two inputs (the inverting and non-inverting input) may be set at the same VRST voltage by short-circuiting the input with the output of the amplifier 111, e.g. by closing the switch CTIA_INIT. Resetting can be done before the end of an exposure, as will be explained below with reference to embodiments of a second aspect of the present invention. The presence of the loop 118 is optional, and the present invention may include other means of resetting the input node IN, for example a reset transistor to a drain. As explained earlier, the reset signal can be obtained at different gains.

In some embodiments of the present invention, more than two feedback loops including feedback capacitors may be included. The further feedback loop may also include a connection to a reference supply VREF via a switch for precharging the capacitor, and a switch for connecting or disconnecting the loop and for selectably isolating or connecting the capacitor to the output node. This allows defining more than two gains. For example, a high, medium and low gain can be defined, by activating respectively one, two and three feedback loops including a feedback capacitor each. Thus, more than two transfers may be provided during exposure of the sensing element. The present invention is not limited to transfer of charges during exposure. In some embodiments, two transfers may be provided at the end of the exposure, by providing a first transfer to a first capacitor C_HG and, if the capacitor reaches saturation, by providing a second transfer during which the excess charges are transferred to a second capacitor C_LG.

In embodiments of the present invention, the sampled signals may be multiplexed, stored, compared, or otherwise manipulated, in order to provide an offset-free readout with at least two gains. For example, correlated double sampling (CDS) can be provided, which gives efficient offset cancellation, as well as reduction of thermal noise and 1/f noise. Thus, providing CDS allows reducing noise (e.g. noise generated by switching CTIA_INIT) and reducing the noise floor.

Figure 3B:
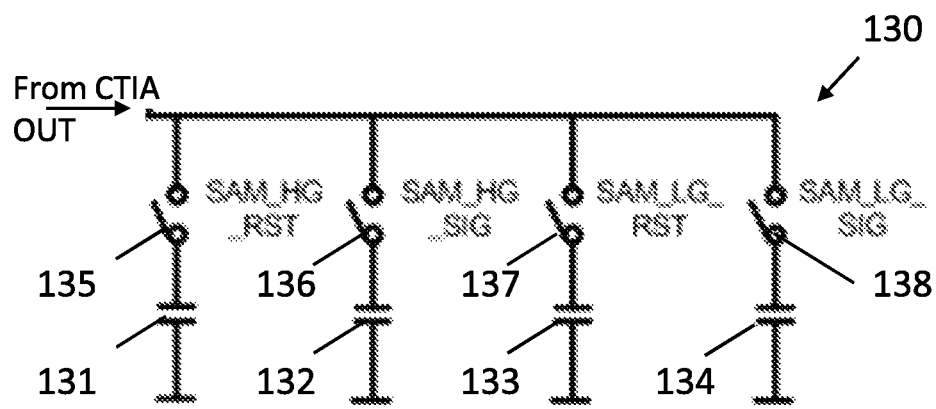
FIG. 3B illustrates in more detail a CDS circuit in accordance with embodiments of the present invention.

FIG. 3B shows a signal manipulation portion 130, for storing a plurality of signals obtained at the output node OUT of the amplifier. Such circuit can be used for performing CDS. The signal manipulation portion 130 comprises four legs coupled in parallel between the output node OUT of the CTIA 110 and ground. The connection to the output node OUT of the CTIA is indicated with the arrow. Each leg comprises a storage element 131, 132, 133, 134 and a switch 135, 136, 137, 138.

The CTIA 110 of FIG. 3A may provide two sampled signals for the reset levels of the input node IN at different gains, and two sampled signals for charges transferred to the input node IN, also at different gains. So in total, four signals may be obtained. Each of these signals may be stored in one of the capacitors of the signal manipulation portion 130. Where in embodiments of the present invention reference is made to "CDS capacitor", reference is made to a capacitor for storing sampled signals in such circuit. For example the high gain signals for the charge at reset levels and for the charge transferred can be stored in the first two CDS capacitors 131, 132, and the respective signals for low gain can be stored in the other two capacitors 133, 134. The storage in the correct capacitor can be ensured by using a switch 135, 136, 137, 138 between the connection to the CTIA (the output node OUT) and each CDS capacitor, which may be grounded. For example, in order to store the high gain offset signal in the first CDS capacitor 131, its respective switch 135 may be kept closed, and the rest of switches 136, 137, 138 may be kept opened. Subsequently, when the low gain offset signal is obtained and is to be stored in the capacitor 133, the switch 135 may be opened and the respective switch 137 may be closed, thus allowing the signal to be stored in the CDS capacitor 133. Once each signal is obtained for the charges at reset level and transferred charges, CDS can be performed and the signals can be compared, subtracted, etc. for each gain.

The number of CDS capacitors may be at least four, e.g. two per feedback loop including a feedback capacitor, or two per variation (without repetition) of active and inactive feedback loops including feedback capacitors, etc.

The readout circuit 100 is not limited to a CTIA and a CDS circuit, and instead of a CDS circuit as illustrated in FIG. 3B, other circuits and elements for manipulating the obtained signals can be included for removing the signal offset.

The present invention further includes a radiation sensor 140, of which one embodiment is shown in FIG. 2, for example an IR sensor and/or an optical sensor, semiconductor sensors, e.g. silicon sensors sensitive to photon energy, including a sensing portion 120, for example at least one pixel, and a readout circuit 100, which may include a signal manipulation circuit 130 such as a CDS circuit.

For example, the sensing portion 120 may include at least one sensing element 121, for example two sensing elements or more. The at least one sensing element may include a transfer gate TX1 for transferring charges generated and accumulated in the sensing element 121 to a floating node, for example an input node IN of the readout circuit 100. The sensing portion 120 may be monolithic, e.g. it may be provided in a semiconductor chip such as a silicon chip. The readout circuit may be or may include an integrated circuit, e.g. a semiconductor chip (which may be integrated also with the sensing portion 120 in the same chip). In some embodiments, the sensing portion 120 includes drain gates TX2, for example drain transistors or anti-blooming gates, for draining away any generated charge in the sensing element which may remain after transfer.

In such sensor 140, the non-inverting output of the amplifier 111 in the readout circuit 100 may be connected to a reset voltage supply with a sufficiently high voltage, so as to ensure a sufficient transfer of charges, in order to provide at least acceptable levels of sensitivity. The voltage should be high in comparison with the voltage of the sensing element 121 (as shown in FIG. 3A) of the sensing portion. For example, in embodiments of the sensor 140, a photodiode may be used as sensing element 121, the photodiode presenting a predetermined pinning voltage. Thus, the reset voltage may be higher than the pinning voltage of the photodiode, in order to obtain sufficient charge transfer (e.g. complete charge transfer) with little or no lag. For example, VRST may provide 4V. The present invention is not limited to this voltage, and other voltages may be used. For example, the voltage it can be chosen in accordance with the type of circuit, functionality or type of sensing element. For example, for a sensing element with a P-node connected or connectable to the input IN of the CTIA, the voltage may be lower than 4V, for example 0V as the reset voltage.

Figure 4:
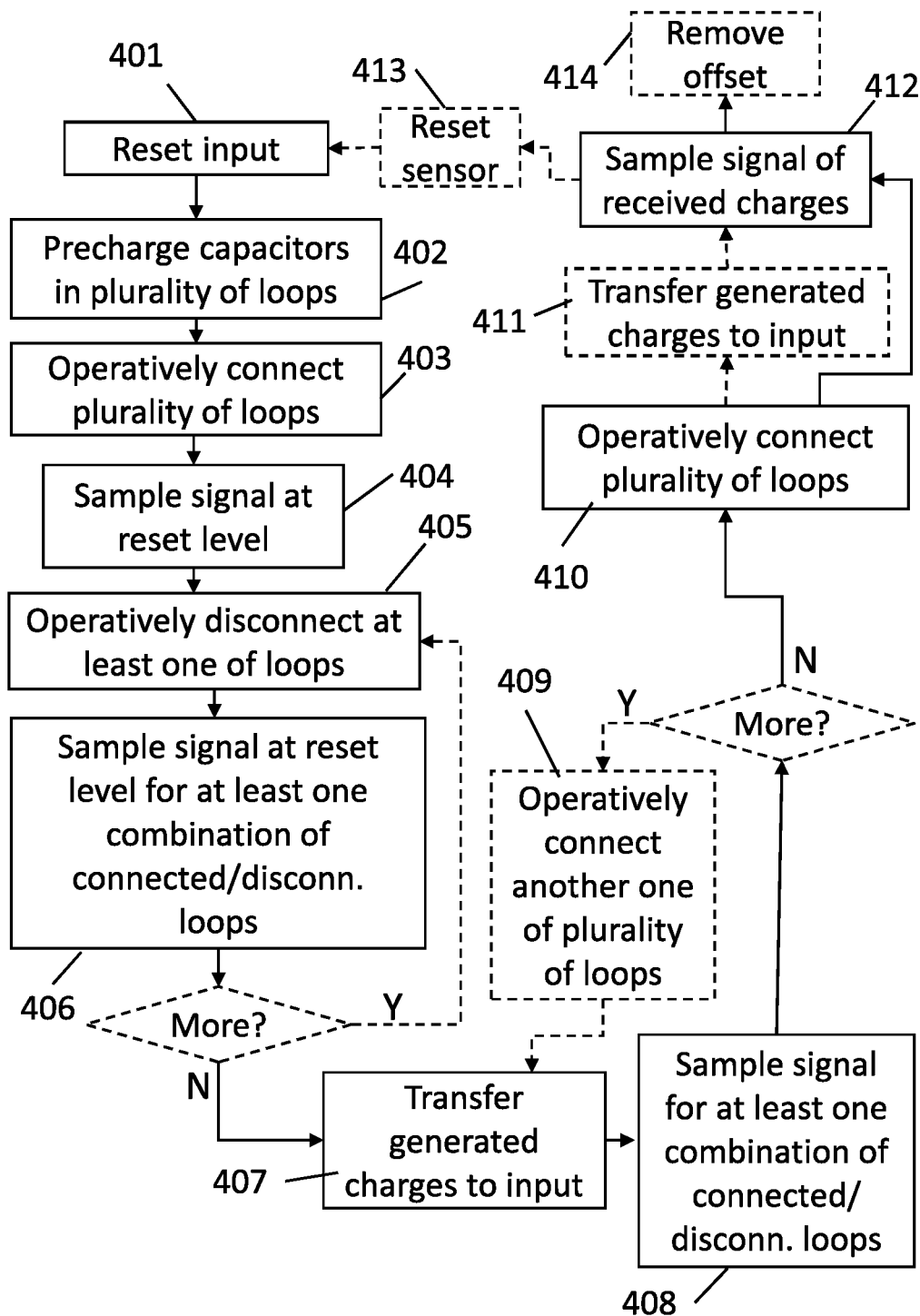
FIG. 4 illustrates a method of reading out charges generated in a sensing portion, in accordance with embodiments of the present invention.

In a second aspect, a method of reading out charges generated in at least one sensing element is provided. The method can be applied to a CTIA in accordance with embodiments of the first aspect of the present invention. FIG. 4 shows steps of this method, also including optional steps in dashed lines. The method includes, after resetting 401 charges from the input node IN of the amplifier, preloading or precharging 402 feedback capacitors, each capacitor being in one feedback loop of a plurality thereof.

The step of resetting 401 may be done by applying a reset voltage to the input. For example, this can be done while there is no transfer of charges from any sensing element, by short-circuiting the input and the output of the amplifier while the non-inverting input is connected to a reset voltage supply, e.g. by operatively connecting a feedback loop with no capacitors (for example, closing the switch CTIA_INIT of FIG. 3A).

The step of precharging 402 may include applying a voltage (using e.g. the supply VREF) to the capacitors, specifically to the node not connected to the input, while the other node is connected to the input of the amplifier. The voltage is applied to the capacitor while the capacitor is not connected to the output (e.g. by closing switches 114, 115 V_INIT while the feedback switches 116, 117 are open), thus preventing at this moment leakage of the precharged capacitors to the output. For example, the other node (the node not connected to the input of the amplifier) may be connectable to the output of the amplifier via a switch (feedback switch), which is open during precharging.

Once the capacitors are precharged, the precharging may stop (for example, by opening switches 114, 115 connecting the capacitors C_HG, C_LG to VREF). Then the plurality of loops are operatively connected 403 (e.g. by closing the feedback switches 116, 117, shown in FIG. 3A) and the (charge-to-voltage) signal is sampled 404 at the output with a predetermined gain. Any charge present in the input node after the resetting (known as charges at reset level) will affect the readout, by making the voltage across the capacitors drop, which can be detected at the output because the charge of the capacitors is known. No charge at the input node would mean a readout of the reference voltage itself, and zero offset. Thus, preloading the feedback capacitors allows extracting an offset signal from charges present after reset of the input node IN and before charge transfer. Using different feedback capacitors and combinations thereof would allow obtaining a plurality of signals representative of the offset at different gains.

One or more loops may be then disconnected 405 and the signal may be sampled 406 again, for a different gain. This process can be repeated several times, obtaining a collection of offset signals for different combinations of feedback loops present.

Then, charges generated at one or more sensing elements are transferred 407 to the input IN of the amplifier, for example, by transferring them to a floating node, e.g. a floating diffusion node, which is electrically connected to the input, e.g. the inverting input, of the amplifier 111, shown in FIG. 3A. A transfer gate can be used for the transfer, or alternatively the transfer of charges may be performed at the beginning of the exposure (sampling reset voltages) and at the end of the exposure (sampling signal voltages), with no need of transfer gate.

The signal generated at the output are sampled 408 while at least one feedback loop is operatively connected or disconnected, defining a gain. This process can be repeated several times, by operatively connecting 409 different feedback loops of the plurality and obtaining different transferred charges to the output several times, for different gains. This can be performed during the exposure (before the end of exposure), or at the end of the exposure.

The method includes operatively connecting 410 all the feedback loops. In this way, all the feedback capacitors are connected to the input and output and are operatively active or connected.

The signal from the transferred charges received at the input are then sampled 412 again. At this point, the exposure may be considered complete, and the charge generated in the sensing element has been transferred at least twice. Preferably, the first transfer is performed using not all of the feedback loops and the second is performed using all of them, so as to reduce chances of saturation of the capacitors if the signal is large.

In some embodiments, the charges generated during the exposure in the at least one sensing element are transferred 411 once more, for example at the end of the exposure, if the first transfer 408 was performed before the end of the exposure.

In summary, the transfer of charges, including charges generated during the exposure, may take place only at the end of the exposure; the charges are transferred 408 to a first feedback capacitor C_HG and excess charges may be transferred 411 to the second feedback capacitor C_LG, and in other embodiments, the first transfer can be performed before the end of exposure and the second transfer at the end.

Thus, excess charges can be taken into account for the total signal with reduced noise and offset, because the present invention allows CDS.

Thus, it is possible to divide the transfer of charges in two or more stages, at the end or during exposure. The present invention is not limited to this sequence of steps. For example, the signal may be sampled first when all the feedback loops are operatively connected, and a further subsequent time when only some or one feedback loop is operatively connected. However, using all the feedback capacitors towards the end of the exposure may be advantageous because the amount of charges during exposure may increase while the number of operatively connected feedback capacitors also increases, thus improving signal-to-noise ratio. This technique can be used if every pixel (e.g. every sensing element) is connected to a different CTIA, for example in case of a line sensor. When a single CTIA is provided to a group of sensing elements (as shown in FIG. 3A), multiple sampling can be performed, by simply sampling the signal multiple times.

Other steps may also be included. For example, the sensor may be reset 413, for example by resetting the sensing elements (e.g. by activating an antiblooming gate TX2 as shown in FIG. 3A). Then the cycle may start again by operatively deactivating the feedback loops (e.g. by opening the switches 116, 117 of FIG. 3A) and resetting 401 the input IN of the amplifier as explained.

In embodiments of the present invention, the sampled signals from transferred generated charges may be manipulated, and its offset may be removed 414. Each signal was obtained with some or all loops connected, thus with a predefined gain, after and before a transfer of charges. The signal before any transfer of charges and the signal after a transfer of charges can be compared for the same operatively connected feedback capacitors, thus for the same gain. Removal 415 of offset can be done for example by CDS for each gain.

Figure 5:
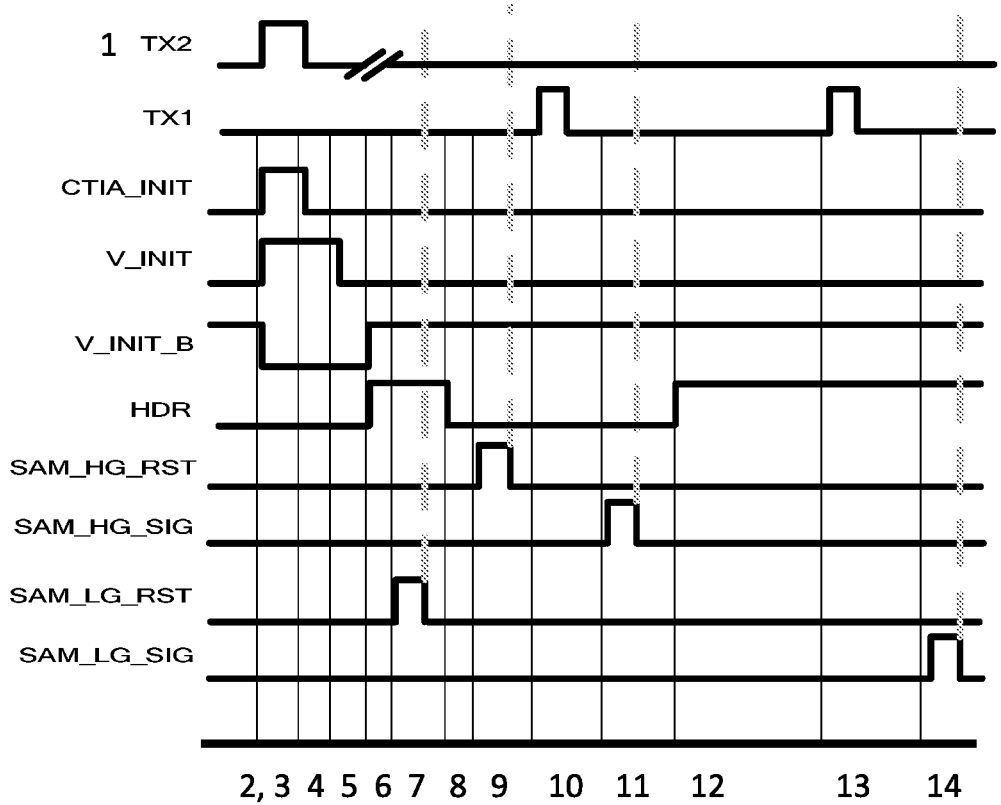
FIG. 5 illustrates an exemplary pulse sequence for controlling the readout circuit in accordance with embodiments of the present invention.

An exemplary sequence is shown in FIG. 5 for two feedback loops. Reference is made to FIG. 3A and FIG. 3B. FIG. 5 shows the pulses applied to the gates TX2, and to the gates TX1 for transfer of charges from sensing elements. It also shows the pulses applied to CTIA_INIT for resetting the input IN.

The pulses applied to the switches 114 and 115 connecting the supply VREF and the capacitors C_HG, C_LG may be simultaneous, and in this case they are indicated with a single sequence V_INIT. On the other hand, the pulses applied to the feedback switches 116, 117 need not be simultaneous, so they are shown with different timings V_INIT_B and HDR (meaning that the HDR activation will set the readout in high dynamic range).

The last four sequences describe the pulses applied to the switches 135, 136, 137, 138 of the circuit (e.g. CDS circuit) shown in FIG. 3B, for storing each sampled signal.

The exemplary operation is described in 14 sequential steps. The steps are:

1.—At the TX2 falling edge, the photodiode starts with a new exposure cycle (step represented at the top of the sequence).

2.—Just before the end of the exposure, the input node (floating node) is reset to VRST by activating the CTIA_INIT switch. Input and output of the CTIA are short-circuited and the two input nodes of the CTIA are equal in voltage.

3.—V_INIT switches are activated, VREF voltage is forced on the two CTIA feedback capacitors C_HG and C_LG.

4.—Deactivation of the CTIA_INIT disconnects the CTIA output from its input.

5.—Deactivation of the V_INIT makes the right node of the feedback capacitors C_HG and C_LG electrically "float" (as they are not connected to a voltage or to ground).

6.—The pulses V_INIT_B and HDR activate the feedback switches 116, 117 to set the CTIA amplifier output DC level close to VREF.

7.—The SAM_LG_RST 137 switch is activated to sample the low gain reset voltage representative of a low gain offset signal.

8.—Deactivation of the HDR switch 117 will set CTIA in the high gain mode.

9.—The SAM_HG_RST switch 135 is activated to sample high gain reset voltage representative of a high gain offset signal.

10.—The clocking of TX1 will transfer the pixel charge (e.g. charges generated in the sensing element of the sensing portion 120) to the CTIA.

11.—The SAM_HG_SIG switch 136 is activated, so as to sample high gain signal voltage representative of the high gain signal produced in the input by transferred charges.

12.—The HDR pulse activates feedback switch 117 to connect the capacitor C_LG to the CTIA output, the charge on C_HG will be redistributed to C_LG and C_HG in parallel, and the CTIA operates in the low gain mode.

13.—The transfer gate TX1 is clocked again, to transfer any rest electrons, in the high gain mode and with a large packet of charges in the pixel, to the input of the CTIA. The collected electrons may not be fully transferred due to the lowering of the voltage on the input of CTIA amplifier. The use of a selectable anti-blooming gate TX2 before a subsequent exposure may advantageously remove any non-transferred charges.

14.—The SAM_LG_SIG switch 138 is activated so as to sample the low gain signal voltage representative of the low gain signal produced in the input by rest of transferred charges.

This sequence has the advantage that no further pulse or switch activation is needed before the first transfer (aside of the transfer gate itself), so the configuration of active/deactivated feedback loops used for obtaining the last signal for the reset voltage can be used for the first sampling of generated signals, thus saving time.

As already explained, the present invention is not limited to this sequence of steps, and a different order of steps may be applied. Further steps may be included, for example CDS pulses (including opening and closing the switches of the CDS circuit) after sampling the four signals. Alternatively, the transfer of charges may be performed only at the end of the exposure. Although the transfer may be controlled by a transfer gate TX1, this is optional.

Figure 6:
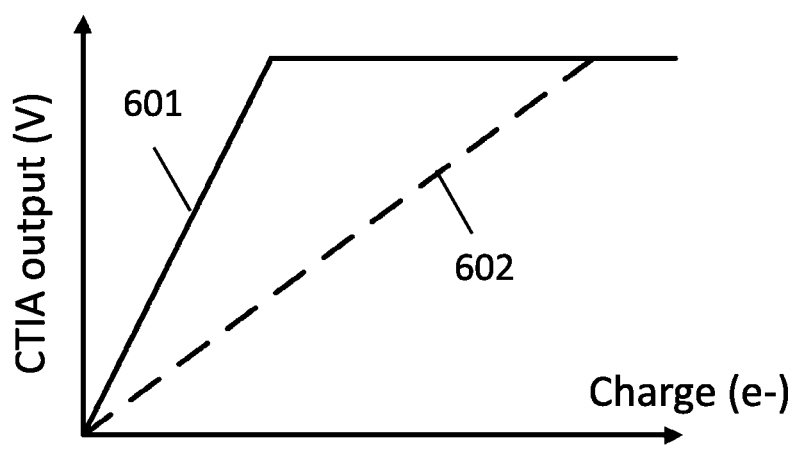
FIG. 6 illustrates an exemplary response curve of a readout circuit in accordance with embodiments of the present invention.

The response curve of high gain and low gain readout is shown in FIG. 6. The output of the CTIA (in volts) is shown as a function of the charges (electrons). The full line 601 corresponds to the high gain readout, e.g. using only one operatively connected feedback loop 112, and the dashed line 602 corresponds to the low gain readout, e.g. operatively connecting all the feedback loops 112, 113, before the transfer of charges. Thus, the dynamic range will be enlarged by the ratio of high/low conversion gain, and saturation is reduced or avoided. The readout circuit is suitable for reading both high and low levels of impinging radiation.

The invention claimed is:

1. A readout circuit for reading out charges from at least one sensing element, the readout circuit including:
an amplifier including a first input node for receiving charges from the at least one sensing element, a second input node for receiving a predetermined reset voltage of 2 V or higher, and an output node for outputting signal voltages;
a first feedback loop and at least one second feedback loop between the output node and the first input node of the amplifier, the first feedback loop comprising a first feedback capacitor and the at least one second feedback loop comprising a second feedback capacitor, for defining different charge-to-voltage conversion gains;
wherein the at least first and second feedback capacitors are each connectable to a reference voltage supply, which provides a voltage between 0.5 V and 1.5 V, via a switch, for pre-loading the feedback capacitors with a predetermined charge different from the charge obtainable from the at least one sensing element, for allowing sampling signals from charges at the input node at a reset level before charge transferal;
wherein the first feedback loop further comprising a switch between the first feedback capacitor and the output node, and the at least one second feedback loop further comprising a switch between the second feedback capacitor and the output node, for operatively connecting and disconnecting each feedback loop, for sampling signals from charges at the reset level at the input node at at least two different charge-to-voltage conversion gains, and for sampling signals from charges received at the input node from the at least one sensing element at at least two different charge-to-voltage conversion gains.

2. The circuit of claim 1, further comprising a signal manipulation portion connected to the output node of the amplifier, for removing offset of the sampled signals.

3. The circuit of claim 2, wherein the signal manipulation portion is a CDS circuit comprising at least four capacitors, the at least four capacitors being in parallel configuration and being selectably connectable, via switches, to the output of the amplifier.

4. The circuit of claim 1, wherein the amplifier is an amplifier with high open-loop gain of at least 1000.

5. An image sensor including a sensing portion and the readout circuit of claim 1.

6. The image sensor of claim 5 wherein the sensing portion includes a pinned photodiode having a pinning voltage lower than the non-inverting input voltage of the amplifier.

7. A method of reading out charges generated in at least one sensing element connected to an amplifier via an input node for receiving charges from the at least one sensing element, there being a first feedback loop with a first feedback capacitor and at least one second feedback loop with a second feedback capacitor between an output node of the amplifier and the input node, the method comprising the steps of:
resetting the input node of the amplifier to a reset voltage of 2 V or higher;
subsequently charging each of the first feedback capacitor in the first feedback loop and the second feedback capacitor in the at least one second feedback loop with a predetermined charge by connecting each of the first feedback capacitor and second feedback capacitor to a reference voltage between 0.5 V and 1.5 V with the first and at least one second feedback loops operatively disconnected,
with at least one of the first or second feedback loops operatively disconnected, and at least one of the second or first feedback loops operatively connected, performing the at least two steps of:

sampling the charge-to-voltage signal at the output node for the predetermined charge, thereby obtaining at least a first sampled voltage signal having at least a first gain for the predetermined charge and any charge at the input node before transfer, and after at least one transfer of charges from the at least one sensing element to the input node of the amplifier, sampling the charge-to-voltage signal at the output node, thereby obtaining at least a second sampled voltage signal having the first gain;

and with each of the first and at least one second feedback loops operatively connected, performing the at least two steps of:

sampling the charge-to-voltage signal at the output node for the predetermined charge, thereby obtaining a third sampled voltage signal having at least a second gain for the predetermined charge and any charge at the input node before transfer, and after at least one transfer of charges from the at least one sensing element to the input node of the amplifier, sampling the charge-to-voltage signal at the output node, thereby obtaining a fourth sampled voltage signal having the second gain.

8. The method of claim 7, further comprising providing removing offset of the signal by correlated double sampling, using the first and second sampled voltage signals for at least a first gain, thus obtaining a first correlated signal, and providing correlated double sampling using the at least third and fourth sampled voltage signals for the at least second gain, thus obtaining a further correlation signal.

9. The method of claim 7, further comprising storing each sampled charge-to-voltage signal in a different capacitor connected to the output node of the amplifier.

10. The method of claim 7, wherein the step of charging each of the first feedback capacitor in the first feedback loop and the second feedback capacitor in the at least second feedback loop comprises applying a reference voltage.

11. The method of claim 10, wherein the step of charging each of the first feedback capacitor in the first feedback loop and the second feedback capacitor in the at least second feedback loop comprises connecting the capacitor to a reference voltage supply at a node between the capacitor and the output of the amplifier.

12. The method of claim 7, further comprising:

operatively connecting the first and the at least one second feedback loops after charging each of the first feedback capacitor in the first feedback loop and the second feedback capacitor;

subsequently performing the step of sampling the charge-to-voltage signal at the output for the predetermined charge and any charge at the input, thereby obtaining the third sampled voltage signal having the second gain, subsequently operatively disconnecting one of the first or at least the second feedback loops;

subsequently performing the step of sampling the charge-to-voltage signal at the output for the predetermined charge, thereby obtaining the first sampled voltage signal having the first gain;

subsequently transferring charges from the sensing element to the input of the amplifier, and performing the step of sampling the charge-to-voltage signal at the output for charges received by the input, thereby obtaining the at least second sampled voltage signal having the first gain;

subsequently operatively connecting each of the first and at least the second feedback loops;

subsequently transferring charges from the sensing element to the input of the amplifier, and performing the step of sampling the charge-to-voltage signal at the output for charges received by the input, thereby obtaining the at least fourth sampled voltage signal having the second gain.

13. The method of claim 7, wherein resetting the input node of the amplifier to a reset voltage comprises connecting that input node to the output node of the amplifier.

14. The method of claim 7, wherein sampling the charge-to-voltage signal at the output node with each of the first and at least one second feedback loops operatively connected; and sampling the charge-to-voltage signal at the output node with at least one of the first or second feedback loops operatively disconnected, and at least one of the second or first feedback loops operatively connected is performed after one transfer of charges from the at least one sensing element to the input node of the amplifier.

* * * * *